United States Patent [19]

Le Pesant et al.

[11] Patent Number: 4,569,575

[45] Date of Patent: Feb. 11, 1986

[54] ELECTRODES FOR A DEVICE OPERATING BY ELECTRICALLY CONTROLLED FLUID DISPLACEMENT

[75] Inventors: Jean P. Le Pesant, Gif sur Yvette; Michel Hareng, La Norville; Bruno Mourey, Boulogne Billancourt; Jean N. Perbet, Gif sur Yvette, all of France

[73] Assignee: Thomson-CSF, Paris, France

[21] Appl. No.: 622,170

[22] Filed: Jun. 19, 1984

[30] Foreign Application Priority Data

Jun. 30, 1983 [FR] France ................................. 83 10914

[51] Int. Cl.⁴ .......................... G02F 1/01; G02B 26/00
[52] U.S. Cl. .................................... 350/355; 350/359; 350/392
[58] Field of Search ............ 350/353, 355, 359, 362.3, 350/392; 365/43, 45, 127, 129, 134, 146–147; 340/788; 364/862

[56] References Cited

U.S. PATENT DOCUMENTS 3,541,534 11/1970 Bobeck et al. .................... 365/43
4,079,368 3/1978 DiStefano ........................ 365/127

FOREIGN PATENT DOCUMENTS

WO80/00103 1/1980 PCT Int'l Appl. .

OTHER PUBLICATIONS

IBM Technical Disclosure Bulletin, vol. 22, No. 1, Jun. 1979, N. H. Runyan, "Electrostatic Liquid Display Devices", p. 325.

Xerox Disclosure Journal, vol. 4, No. 3, May/Jun. 1979, N. K. Sheridon, "Electrocapillary Imaging Devices for Display and Data Storage", pp. 385–386.

Primary Examiner—William H. Punter

[57] ABSTRACT

The invention relates to devices by means of which it is possible to cause fluid globules to circulate within a capillary space by means of pairs of electrodes establishing capture sites. The invention provides a device in which the electrodes of two successive pairs have in common at least one indentation comprising a convex part and a concave part. The invention is applicable, in particular, to the visual display and storage of electrical data by means of movable indices in the form of globules.

11 Claims, 7 Drawing Figures

ELECTRODES FOR A DEVICE OPERATING BY ELECTRICALLY CONTROLLED FLUID DISPLACEMENT

BACKGROUND OF THE INVENTION

The present invention relates to devices incorporating electrically controlled displacement of fluids, comprising a capillary space delimited by two confining plates bearing pairs of electrodes. The partial filling of this space makes available a globular phase of which the fluid elements may move within a lacunary phase. The movements are controlled electrically by applying electrical voltages to the pairs of electrodes. Thanks to a difference of permittivity between the two fluid phases and to the electric field gradients resulting from the voltages applied, the electrical polarisation gives rise to volumic forces permitting displacement of the fluid elements within the extent of the capillary volume. More specifically, a fluid globule which has a higher permittivity than its environment will be attracted towards a pair of electrodes carrying an electric voltage. This globule tends to retain its individuality due to the action of the surface tension forces, and assuming the same to be totally unconstrained, it may be illustrated as a circular drop flattened between the two confining plates. The spread of a drop of this kind is constant in the case of a capillary space of uniform height. To assure a minimum obstruction of the displacement of a fluid element, the contact surfaces of the confining plates should provide a low degree of wettability, which may be obtained by an appropriate treatment. It may be advantageous however to utilise molecular forces within spaces delimited by electrodes to force the globules to remain captive even if the electrical control voltage is neutralised. The passage from one capture site to the adjacent site requires a transient electrical voltage permitting to overcome the molecular forces which act as return forces. The forces which have been referred to are all greater than the forces which may result from an acceleration incurred by the device, since the fluid elements are of sufficiently small size for the forces of electrical or molecular origin to overcome the inertial or gravitational forces.

The configuration imparted to the electrodes permits devising the trajectory or path of one or more globules between a storage space and a collector space. Within the extent of the capillary volume, it is possible to establish a path produced by means of a series of electrodes which receive voltage pulses, thanks to which a fluid which is to be displaced converges towards a field gradient zone whilst expelling the fluid of lesser permittivity surround the same. This displacement may be repeated progressively by chronological staggering of the voltage pulses.

The displacement of a fluid from one pair of electrodes to the adjacent pair of electrodes raises the problem of the pattern and form imparted to the electrodes. As a matter of fact, localising the fluid for the purpose of maintaining the positions secured, leads to the capture zones being spaced apart to act against accidental mixing of the fluid globules which tend to join together as soon as they can meet. If the capture zones coincide with the zones equipped with electrodes, this leads to separating the electrodes farther away from each other.

The electrical displacement control is connected with the interaction between an electric field gradient and the fluid globule which is to be displaced. Upon observing two adjacent sites, it is apparent that the fluid globule occupying one of the sites should be situated within the range of influence of the adjacent site so that the attractive action may be sufficiently strong. This amounts to placing the pairs of electrodes closer to each other or to proceed so that each globule has a greater extension than the electrodes assuring its immobilisation or its displacement. With the known electrode forms, it is difficult to reconcile two mutually opposed functions consisting in establishing a precise immobilisation and in securing a substantial electromechanical stress. The utilisation of electrodes of rectangular or triangular shape does not provide a satisfactory compromise. Furthermore, to impose a direction of displacement on the globules, it is necessary to resort to comparatively complex sequences of electrical pulses.

SUMMARY OF THE INVENTION

The invention has the object of eliminating the shortcomings mentioned in the foregoing, by the utilisation of electrodes comprising indentations. An indentation assures interpenetration of the electrodes, such that the contour of the steady-state fluid occupying a capture zone is intersected by the indentation of the pair of electrodes defining the adjacent capture zone. If appropriate, a preferential direction of displacement may be promoted by means of the mode of interpenetration of the electrodes.

The invention provides a device incorporating electrical control of fluid displacement by fluid globules which share a capillary space formed between two confining plates with a non-miscible fluid of lesser permittivity, the surface tension properties resulting from the structure of the said plates assuring that the said fluid globules are retained along at least one circulation path appertaining to the said space, the displacement of the said fluid globules along the said path being assured by means of the concentratory volumic forces engendered by pairs of electrodes arranged along the said path, the said electrodes being carried by the said confining plates and connected to an electric control generator, and the electrodes of two consecutive pairs having at least one indentation in common.

BRIEF DESCRIPTION OF THE DRAWINGS

A better understanding of the invention will be obtained from the following description and from the accompanying drawings, in which.

DESCRIPTION OF THE PREFERRED EMBODIMENTS

Figure 1:
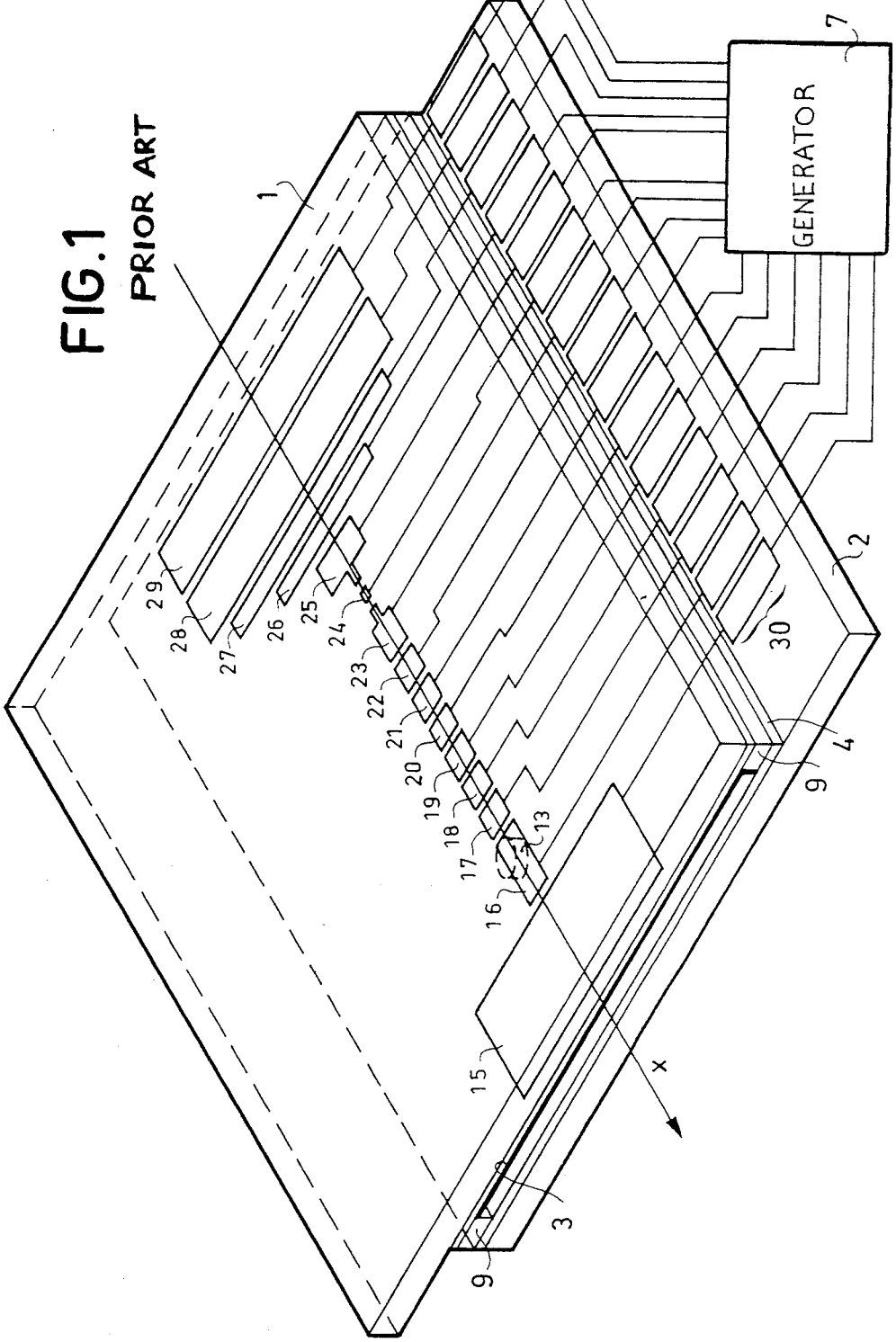
FIG. 1 is an isometric view of a device incorporating electrical control of fluid displacement of a known kind.

In FIG. 1 is shown a known device incorporating electrical control of fluid displacement. A capillary space is delimited by two confining plates 1 and 2 with by interpasing spacers 9. The typical height of the capillary space is of the order of several tens of microns, its other two dimensions being much more substantial in order to establish a field within the extent of which globules of fluid may move whilst having available two degrees of freedom.

The capillary volume is shared by at least two non-miscible fluids of different permittivity. One of the filling fluids has a globular phase 13 and is advantageously formed by a liquid having a high permittivity combined with low electrical conductivity. The other filling fluid completes the capillary volume and is advantageously formed by a gas or vapour to promote its flow during the displacements of the elements 13 of the globular phase. The fluid surronding a globule 13 is typically formed by air and the fluid forming the globule is a hydrocarbon in liquid form, such as cyclohexanone. The quantity of liquid contained within a globule 13 is sufficient for the same to appear in the form of a drop flattened between the confining plates 1 and 2. The plates 1 and 2 are made of a material providing a low degree of wettability with respect to the liquid which is to be displaced within the capillary volume. As is apparent from FIG. 1, this low degree of wettability may be obtained by means of an internal coating on the plates 1 and 2 appearing in the form of extremely thin deposits 3 and 4. By way of example, these deposits 3 and 4 advantageously have a thickness of the order of a millimicron and may be formed by an organosilane such as N, N-dimethyl-N-octadecyl-3 aminopropyltrimethoxysilyl chloride. This deposit has been polymerised under nitrogen at 110° C. after hydrolysis of the methoxysilane groups and forming of hydrogen and siloxane bonds on the substrate by chemisorption. The purpose of a treatment of this nature is to improve the cohesion and mobility of the liquid globules within the capillary volume. The cohesion of the liquid globule 13 is assured by the surface tension forces. In the unconstrained state, that is to say in the absence of other forces, the form of the globule is that of a circular element. In view of the low quantity of material contained in a globule, the intertial or gravitational forces may be ignored as compared to the surface tension forces.

To form a complete device, FIG. 1 shows that the plates 1 and 2 are equipped with pairs of electrodes. To simplify illustration, only the lower electrodes of each pair are illustrated. The electrodes 15 to 29 inclusive have been disposed on the plate 2 before the non-wetting layer 4 is deposited thereon. These electrodes are connected to marginal conductive terminals 30 to which is connected a generator 7 of pulsed electrical voltages. Each electrode visible in FIG. 1 thus represents the bottom plate of a capacitor, the other capacitor plate borne by the plate 1 being formed by a counter-electrode of the same shape or formed by a common counter-electrode. Apart from their electrical function, the electrodes 15 to 29 may act as capture means as regards the liquid globule 13. As a matter of fact, the molecular forces may act on the globule 13 via the non-wetting deposit 4 in order to allocate to the same a preferential locus or site within the outline of the electrode. The retention in position of a globule 13 is thus assured by a molecular return force which dispenses with the constant application of an electrical voltage for immobilising the globule at a particular position. This return force obviously has to be overcome by the volumic displacement forces to alter the position of the globule within the capillary space controlled in this manner.

The electrical function of the electrodes is to create locally an electric field gradient within the capillary space, which in association with the electrical polarisation of the fluids present, produces volumic forces of which the appreciable or detectable resultant attracts the globule 13 between the plates of each capacitor. This attraction increases in step with the field gradient intensity, and with the difference of permittivity of the fluids present at either side of the interface separating them (globule outline). In the case of capacitor plates having a small spacing as compared to the transverse dimensions, the field gradient is high close to the edges. It is necessary to adopt an extension close to that of the electrodes for each globule, and to place the pairs of electrodes close to each other to gain the benefit of an appreciable displacement force. In FIG. 1, by way of example, the electrodes 17 to 22 are of substantially square shape of a typical side length of 0.5 mm and the width of the gaps separating them is typically of the order of 20 $\mu$m. For example, they are formed by deposits of indium and stannium. A deposit of this kind is known under the name "BALTRACON", sold by the BALZERS company. Annealing at 350° C. assures transparency to light.

The electrode layout apparent from FIG. 1 comprises a reservoir zone controlled by the electrodes 26 to 29, a fractionated injection zone controlled by the electrodes 23 to 25, a propagation zone controlled by the electrodes 17 to 22, and a collector zone controlled by the electrodes 15 and 16.

Upon charging the device of FIG. 1 with liquid, the generator 7 supplies an electrical voltage to the pair of electrodes 29, promoting its progress within the capillary space. Applying a voltage to the pair of electrodes 28 causes the liquid to continue its displacement whilst occupying a greater area within the capillary volume for the purpose of forming the reserve of fluid of which the calibrated fractionation provides the globules 13 which are to be displaced. This progress of the layer of liquid towards the injection area is obtained by successive energisation of the pairs of electrodes 27 and 26. The admission of a calibrated quantity of liquid is obtained by energisation of the pairs of electrodes 25,24,23. At this stage, the interelectrode gaps 25,24, and 23 have intercepted liquid at the expense of the reservoir area. Upon cancelling the energising voltage applied to the pair of electrodes 24, the liquid is divided in this area of constriction in such a manner that a globule 13 remains within the pair of electrodes 23. The progress of the globule 13 into the propagation area is obtained by applying voltage to the pair of electrodes towards which it is intended to be displaced and by reducing or cancelling the voltage of the pair of electrodes which had held it captive. The globule 13 ends its travel within a collector area in which it is combined with the liquid already present.

Figure 2:
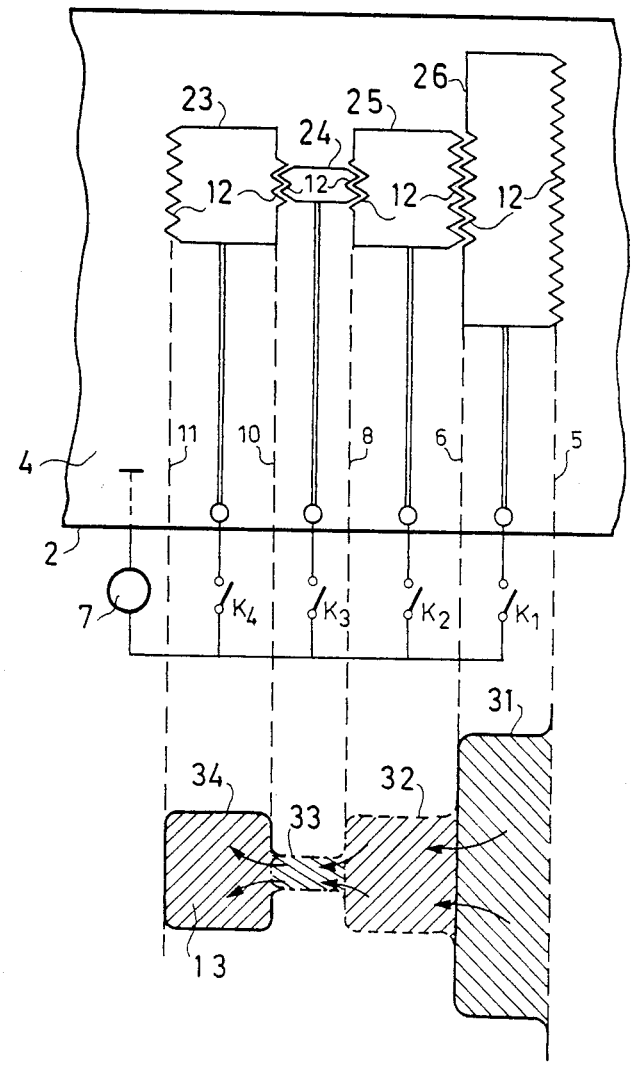
FIG. 2 is a partial view of one arrangement of electrodes in accordance with the invention.

The improvement aimed at by the invention consists in endowing the electrodes with an outline comprising an indentation which results in an encroachment of one pair of electrodes on the adjacent pair. An arrangement of this kind is illustrated in FIG. 2. The same references denoting the same elements as in FIG. 1, it is apparent that the electrode outlines common to two adjacent pairs comprise a gap 12 of sinuous, or of corrugated shape, for example in the manner of sawteeth. In order to illustrate the voltage controls, switching means denoted by switches K1 to K4 inclusive, respectively supplying the electrodes 26,25,24, and 23, have been separated from the generator 7. Several stages of movement of the liquid sheet which is to be displaced have been depicted by hatched areas at the bottom of FIG. 2, these areas actually being situated abreast of the electrodes 26 to 23 but being illustrated separately in relation to the electrodes in question by the related lines 5 to 11.

Firstly, let it be assumed that an electrical voltage is available across the terminals of a generator 7 and that the switch K1 has been closed, the switches K2 to K4 provisionally being open. The liquid then occupies the area 31. If the switch K1 is opened, the liquid remains under the dominance of the molecular forces and, subject to adopting sufficiently closeset indentations 12, it is observed that the front of the liquid assumes a substantially rectilinear outline in the extension of the line 6. Thanks to an indentation of greater amplitude than the width of the interelectrode space, it is apparent that the indentations 12 of the electrode 25 encroach on the left-hand front of the area 31. Upon closing the switch K2, the liquid is thus affected more powerfully by the field gradient generated by the electrode 25 and is attracted more easily as shown by the curved arrows and fills the area 32. Opening the switch K2 causes the front of the liquid to be placed along the line 8. The closing of the switch K3 causes the liquid to be drawn into the area 33 and that of the switch K4 will cause the same to occupy the area 34. The progress from right to left, that is to say from the upstream to the downstream direction, such as described, may also occur in the case of incomplete stress-relieving of the liquid. This amounts to allowing a residual voltage to remain operative on the electrodes situated upstream of the electrode which has had a voltage applied to it. In the case of a fractionation, the switch K3 is opened whilst leaving closed the switches K2 and K4, forcing the liquid to flow back towards the areas 32 and 34 whilst leaving the area 33.

To summarise the preceding, it is apparent that if the electric field is attenuated or interrupted locally, the liquid is released towards a volume of which the extension has a smaller perimeter with respect to the confining surfaces. The pitch and length of the indentations are determined in such a manner that following this release, the volume of liquid to be displaced intersects the indentations of the adjacent pair of electrode which then has voltage applied to it. This electrode layout permits improving the displacement of fluid in any part of an electrode system such as illustrated in FIG. 1. Furthermore, since the indentations are multiple corrugations, the effect is identical whether the displacement occurs in one direction or the other. The direction of displacement is a function of the sequential timing of the control voltages.

It is equally within the scope of the invention to adopt a form of electrode comprising an indentation which establishes the direction of a displacement and simplifies the forms of electrical signals to be provided to cause the liquid globule 13 to progress step by step.

Figure 3:
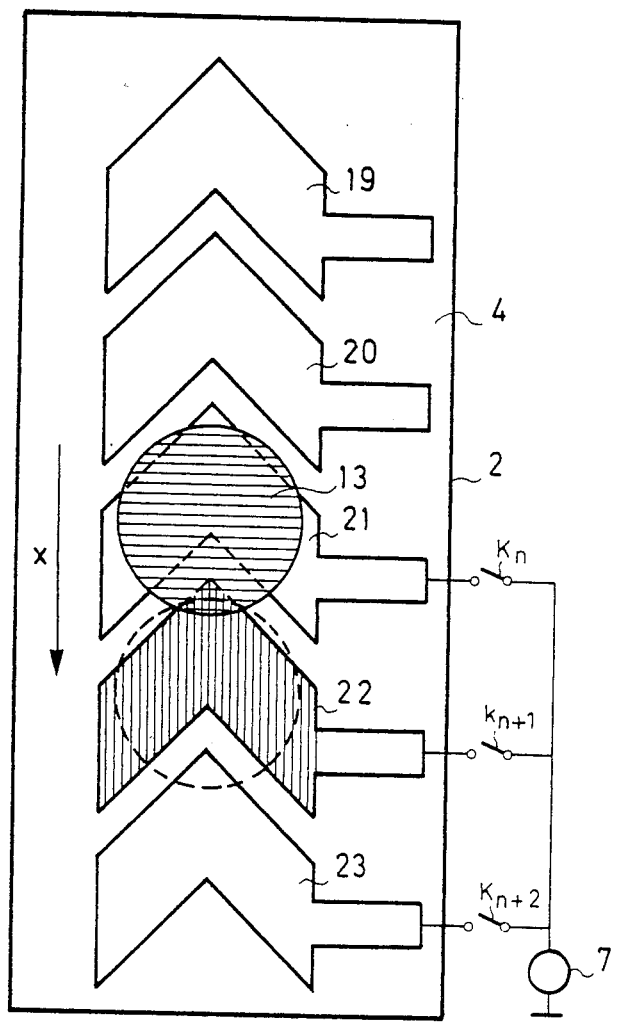
FIG. 3 is a view illustrating another configuration of electrodes according to the invention.

FIG. 3 illustrates a first example of such an arrangement, with its form and arrangement. The same references denoting the elements corresponding to those of FIG. 1, it is apparent that the form imparted in FIG. 3 to the pairs of electrodes 19 to 23 comprises convex parts engaged in concave parts. Typically, the electrodes are in the form of chevrons pointing in the opposite direction to the direction X. Similar effects would be obtained with electrodes which, for example, have the form of crescents, chevrons having triangular branches or of simple arcuate segments.

As apparent from FIG. 3, a system comprising indentations is still being utilised. The globule 13 illustrated in the relaxed or stress-relieved state at the site of occupation defined by the pair of electrodes 21 has a surface area close to the area of the chevron-shaped electrodes. This stress-relieved situation prevails in the open condition of the switches $K_n$, $K_{n+1}$ and $K_{n+2}$ which in conjunction with the generator 7 establish the electrical displacement control. The globule 13 tends to become centred on the barycentre of the electrode 21 and its circular outline is in engagement with the tip of the pair of electrodes 22. If the switch $K_n$ is closed, the liquid contained in the globule 13 is concentrated between the electrodes 21 whilst assuming their shape. It regains its original shape upon opening the switch $K_n$. It may assume an intermediate shape, with an electrical voltage which is merely reduced. The switch $K_{n+1}$ is closed to displace the globule 13 towards the pair of electrodes 22, which has the result of concentrating the liquid under the electrode 22. The electrical voltage needed to cause this displacement is reduced due to the tip of the electrode 22 which partially covers the extension of the globule which is to be displaced. If this voltage were applied to the electrode 20 to cause the globule 13 to regress, it would have to be increased substantially, since the electrode 20 has no hold on the globule 13. Thus, by adopting a voltage value barely sufficient to produce the displacement along the direction X, a single direction of progress is assured by the shape of the electrodes. Re-opening the switch $K_{n+1}$ causes the globule to advance by one step and to regain its circular shape (pecked outline). It is observed that relaxing or stress-relieving the perimeter of the liquid to be displaced, in conjunction with an electrode geometry comprising at least one indentation causes the volume of liquid to leave a capture site for another capture site controlled by another pair of electrodes, to the action of which it will be subjected in preferential manner during the following energising cycle. If the electrodes of odd order are connected to an energising line and the electrodes of even order are connected to another energising line, the globule may be caused to advance step by step by applying the control voltage alternately to the two energising lines. Even one energising line only is sufficient if the geometry is such that the drops do not intersect each other in their stress-relieved form and if the displacements of all the drops of a column such as that illustrated in FIG. 3 are identical and synchronous.

Figure 4:
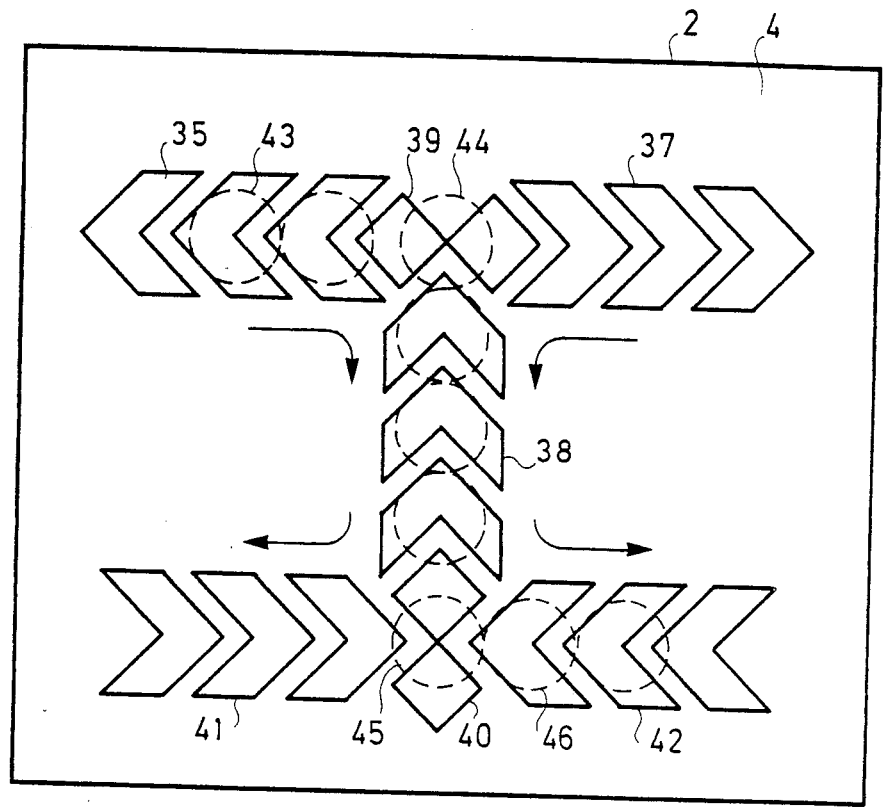
FIG. 4 illustrates an arrangement of electrodes which makes it possible to cause a fluid to flow to and from branches joined to a common trunk.

In FIG. 4, is shown an arrangement of pairs of electrodes enabling liquid globules available on lateral channels to be displaced convergently towards a common trunk, and divergently towards other lateral channels, whilst retaining the choice of direction. The left-hand and right-hand access channels are established by pairs of chevron-type electrodes 35 and 37. These channels permit the flow of fluid globules 43 towards a branch formed by a pair of electrodes 39 occupying an indentation in each of the closest chevrons 35 and 37. The common trunk is formed by chevrons 38 of which the first occupies an indentation in the electrode 39. The left-hand and right-hand output channels are equally formed by pairs of chevron-type electrodes 41 and 42 connected to the common trunk via an electrode 40 of similar form to that of the electrode 39. By means of electrical voltages applied to different pairs of electrodes, the globule 43 may be caused to progress until it occupies the position 44. It may thereupon be caused to travel along the common trunk to reach the position 45 and may finally be displaced towards the right into the position 46.

Figure 5:
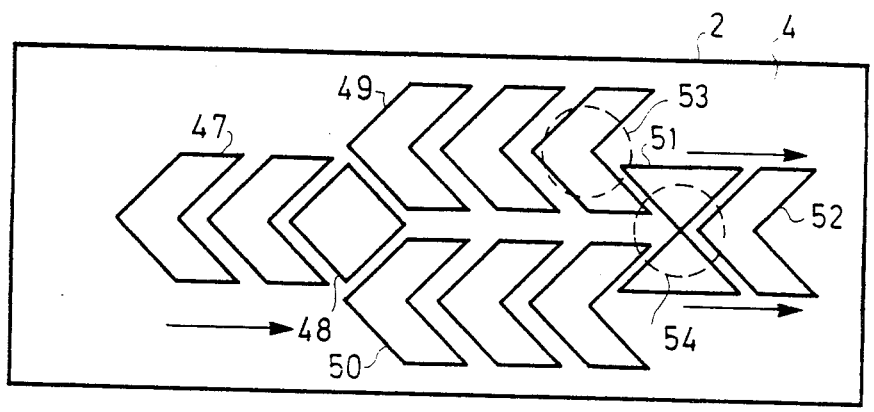
FIG. 5 illustrates an arrangement of electrodes which makes it possible to cause a fluid to flow and to be directed along paths which separate from or meet with each other.

FIG. 5 illustrates another arrangement comprising two branches. One access channel is formed by chevrons 47 and ends in an electrode 48 for its connection to two secondary channels established by chevrons 49 and 50. The secondary channels are connected to an output channel 52 via an electrode 51. A liquid globule present in the access channel 47 may be directed on to one of the secondary channels 49 or 50 to reach the position 53. It is caused to occupy the position 54, to revert to the output channel 52.

Figure 6:
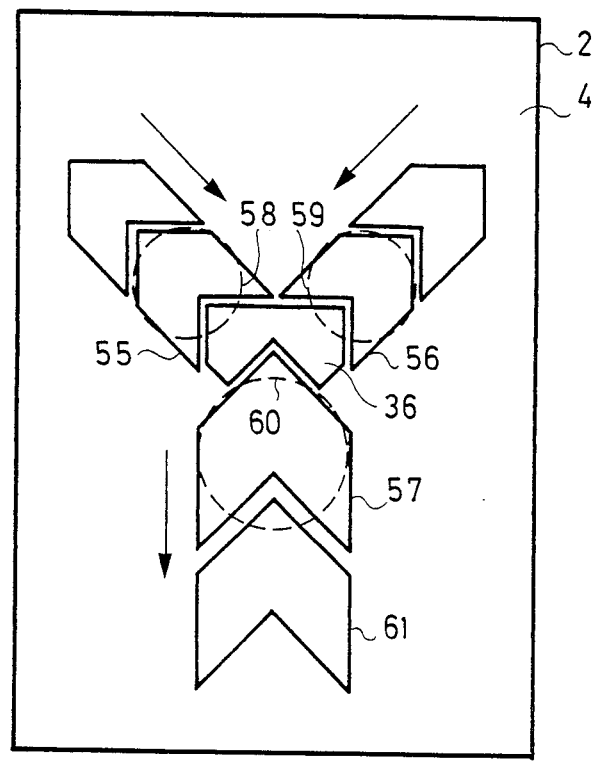
FIG. 6 illustrates an electrode arrangement whereby two incident fluid globules may be fused into only one.

In FIG. 6 is illustrated a star arrangement of chevron-type pairs of electrodes. Liquid globules 58 and 59 of identical or different volumes move towards a nodal site occupied by a pair of electrodes 36. The feed channels are equipped with chevron-type electrodes 55 and 56 of which the surface corresponds substantially to the extension of the globule 58 or 59 which is to be displaced. The amalgamation of the globules gives rise to a globule 60 of larger size which may follow the output channel delimited by pairs of chevron-type electrodes 57,61 having dimensions adapted to the size of the combined globule 60.

The forms of electrodes described in the foregoing comprise an indentation into which is inserted a convex part of the electrode outline. The method consists in utilising a form of electrode which causes a constraint on the form of the fluid globule when the latter is exposed to the electrical polarising field, being a constraint such that it does not correspond to the relaxed or stress-relieved balanced state. When the polarising field is reduced or cancelled, the fluid globule is released into a less constricted form corresponding to a lower surface tension energy, having a smaller cross-sectional perimeter regarding the confining surfaces of the capillary space. This causes the liquid to occupy zones in juxtaposition with the convex portions of the electrodes, accompanied by a retraction of the zones most distant from the peak of the convex part. As a matter of fact, it is apparent from FIG. 3 that upon being stress-relieved, the globule 13 projects beyond the convex part of the electrode 21 whilst withdrawing from its pointed regions. Being filled, the middle of the concave part allows the stress-relieved globule to encroach on the tip of the convex part of the following electrode 22.

Figure 7:
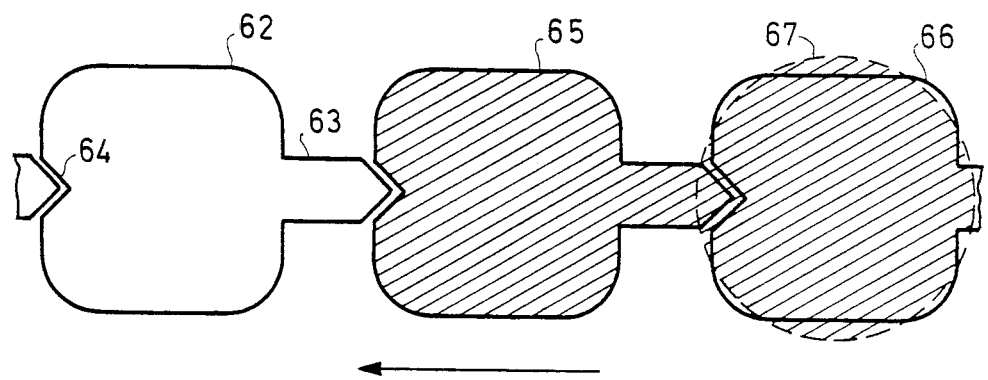
FIG. 7 illustrates a modified form of the electrodes. de

To secure more satisfactory spacing of the electrodes, it is apparent from FIG. 7 that it is possible for the electrodes 62,65 and 66 to have a general shape sufficiently close to that of the stressrelieved liquid globule 67. For example, the electrode has a square shape with rounded corners, comprising a Vee-shaped indentation 64. To assure an easy displacement of the globule, each electrode is equipped with an extension 63 of which the pointed end is placed in the Vee-shaped indentation of the preceding electrode. The displacement of the globule 67 in the direction of the arrow is obtained by means of the pair of electrodes 66 by relaxation of the electrical field created at its level and by energisation of the adjacent pair 65. The liquid impelled electrically by the extremity of the extension of the electrode 65 will flow via this extension to spread out within this adjacent pair of electrodes 65.

A significant advantage of the electrode form illustrated in FIG. 7 is that it permits performing ambilateral or right-angled globule displacements. As a matter of fact, a second extension may be provided between the electrodes 65 and 66, which would be integral with the electrode 66 and of which the tip would engage in a Vee-shaped indentation of the electrode 65. Extensions or indentations may equally be provided on the sides of the electrodes free of these in FIG. 7, and this to allow of globule displacements perpendicular to the direction of the arrow. The series of electrodes illustrated in FIG. 7 may actually form a line of a matrix pattern in which electrodes arranged in column form are able to exchange globules. The practically square shape of the electrodes of FIG. 7 is more appropriate than the chevron shape for displacements organised in two dimensions. By contrast, the chevron shape may equally benefit from an extension situated at the top of the convex part. Such an electrode form would come close to that of a three-branched star and the arrangement would be such that one branch of an electrode would extend into the sector delimited by two branches of the adjacent electrode.

We claim:

1. A device incorporating electrical control of fluid displacement by fluid globules which share with a nonmiscible fluid of lesser dielectric permittivity, a capillary space formed between two confining plates, wherein the surface-active properties resulting from the structure of the said plates assure retention of the said fluid globules along at least one circulation path appertaining to the said space, the displacement of the said fluid globules along the said path being assured by the concentratory volumic forces created by pairs of electrodes arranged along the said path, the said electrodes being carried by the said confining plates and connected to an electrical control generator, and wherein furthermore the said electrodes of two successive pairs have at least one indentation in common.

2. A device according to claim 1, wherein the indentation common to two electrodes delimits a gap of sinuous form between them.

3. A device according to claim 2, wherein the shape of the gap has a sawtooth form.

4. A device according to claim 1, wherein the said electrodes have an outline comprising a convex part and a concave part engaging one in another for forming a flow channel or path.

5. A device according to claim 4, wherein the said outline assumes the form of a chevron.

6. A device according to claim 4, wherein the surface area delimited by the said outline corresponds substantially to the surface area of the said fluid globules.

7. A device according to claim 1, wherein two successive electrodes have at least one concave peripheral indentation in the case of the one electrode, and at least one extension in the case of the other electrode, of which the convex extremity engages in the said concave peripheral indentation.

8. A device according to claim 1, wherein said electrodes are arranged in the form of a common trunk and of lateral channels branching therefrom.

9. A device according to claim 1, wherein the said electrodes are arranged to form branching means.

10. A device according to claim 1, wherein the said electrodes are arranged along star-arranged paths permitting combining two globules into only one.

11. A device according to claim 1, wherein the said electrodes are arranged to form a reservoir zone, a fractionated injection zone, a propagation zone and a collector zone.

* * * * *